United States Patent

Kitamoto et al.

[11] Patent Number: 6,049,493
[45] Date of Patent: Apr. 11, 2000

[54] SEMICONDUCTOR MEMORY DEVICE HAVING A PRECHARGE DEVICE

[75] Inventors: Ayako Kitamoto; Masato Matsumiya, both of Kawasaki, Japan

[73] Assignee: Fujitsu Limited, Kanagawa, Japan

[21] Appl. No.: 08/987,618

[22] Filed: Dec. 9, 1997

[30] Foreign Application Priority Data

Jun. 27, 1997 [JP] Japan .................................... 9-172296

[51] Int. Cl.[7] .................................................. G11C 7/00
[52] U.S. Cl. .......................... 365/203; 365/207; 365/208
[58] Field of Search ................................. 365/203, 190, 365/208, 205, 207

[56] References Cited

U.S. PATENT DOCUMENTS

| | | | |
|---|---|---|---|
| 4,943,944 | 7/1990 | Sakui et al. | 365/203 |
| 5,444,662 | 8/1995 | Tanaka et al. | 365/203 |
| 5,491,435 | 2/1996 | Mun et al. | 365/203 |
| 5,677,886 | 10/1997 | Seo et al. | 365/203 |
| 5,815,451 | 9/1998 | Tsuchida | 365/203 |
| 5,828,611 | 10/1998 | Kaneko et al. | 365/203 |
| 5,859,799 | 1/1999 | Matsumoto et al. | 365/189.09 |

*Primary Examiner*—David Nelms
*Assistant Examiner*—Gene N. Auduong
*Attorney, Agent, or Firm*—Nikaido Marmelstein Murray & Oram LLP

[57] ABSTRACT

During a precharging period, first a bit line is precharged to a first potential and a sense amplifier is precharged to a second potential. Then, the bit line and the sense amplifier are connected together thorough a bit line transfer gate, and the precharge potential at the bit line is set to a third potential in accordance with a ratio of their capacitances. Following this, a word line is rendered active to connect a memory cell to the bit line. In accordance with the potential in the memory cell, a minute voltage is generated to the bit line, and the sense amplifier detects the minute voltage and amplifies it. Since the first and the second potentials differ from each other, the third potential can be an intermediate potential nearer the first potential. For example, when the first potential is set to a ground potential and the second potential is set to one available at a high potential power source, the third potential is set to shift toward the ground potential from half the power source potential. Since this potential is higher than the ground potential, a potential which is higher or lower than the third potential by the equivalent of the minute voltage is generated at a selected bit line. The sense amplifier, therefore, can employ the third potential at the opposite bit line as a reference potential.

7 Claims, 11 Drawing Sheets

FIG.1C $\dfrac{Cb1*V1+Csa*V2}{Cb1+Csa}$ 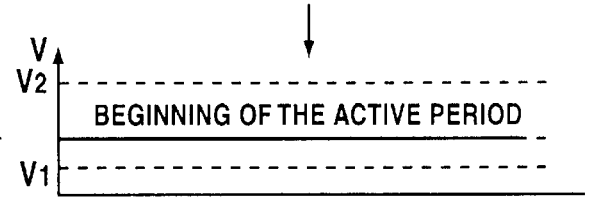

FIG.2C $\dfrac{Cb1*V1+Csa*V2}{Cb1+Csa}$ 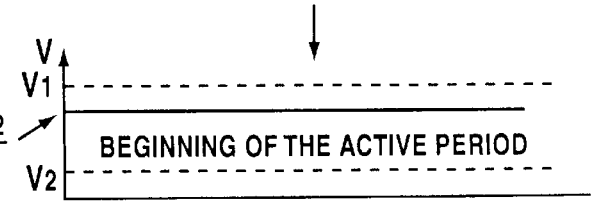

SEMICONDUCTOR MEMORY DEVICE HAVING A PRECHARGE DEVICE

BACKGROUND OF THE INVENTION

1. Field of the Invention

The present invention relates to a semiconductor memory device, such as a dynamic random access memory (DRAM), and in particular to a semiconductor memory device which can increase the sensitivity of a sense amplifier and which does not require the generation of a bit line reference voltage using a dummy cell.

2. Related Arts

A DRAM, one type of semiconductor memory device, generally has a memory cell consisting of one transistor and one capacitor, and information is recorded in the DRAM by accumulating an electric charge in the capacitor of the memory cell. A potential of the capacitor of the memory cell is read to a bit line, and a small difference between potentials generated at a bit line pair is detected and amplified by a sense amplifier.

For the conventional DRAM, mainly employed is a method for setting a precharge level at a bit line to half a potential of a power source on the high potential side. When the high potential side power source is Vcc, the precharge potential at the bit line is Vcc/2. And when the potential of the memory cell is high because an electric charge has been accumulated in the capacitor, the potential at the bit line is increased from the precharge potential by the equivalent of a minute voltage. When the potential of the memory cell is low because an electric charge has not been accumulated, the potential at the bit line is dropped from the precharge potential by the equivalent of the minute voltage. The potential at a bit line on the opposite side is maintained at the precharge level, and the minute voltage difference is generated between the two bit lines. The minute voltages difference is detected and amplified by a sense amplifier.

Since a precharge potential is set to half the potential at the high voltage side power source, there is no need for a circuit, such as a dummy cell, that generates a reference voltage on an opposite bit line.

However, in accordance with the recent low power consumption trend, the power voltage tends to be lower, or an internal reduced power voltage lower than the external power voltages tends to be internally generated and employed. When half the potential of the power source is employed as a bit line precharge potential, therefore, a problem arises in that it is difficult to drive an amplification transistor in a sense amplifier. That is, the sense amplifier generally serves as a differential circuit comprising a pair of transistors whose source terminals are connected in common, and even when half the potential of the power source is applied to the gate terminals of the transistors, a gate-source voltage tends to be lower than or near a threshold voltage of the transistors. As a result, the sensitivity of the sense amplifier is degraded, or in the worst case, the sense amplifier can not be driven.

Instead of the method wherein half the potential of the power source is used as a precharge potential, proposed is a method for setting a precharge potential at a bit line to a ground potential or to a potential available at a high potential side power source. According to this method, transistors in a sense amplifier can be adequately driven. When the precharge potential at a bit line is set to a ground potential or to a potential available at a high potential power source, a circuit to generate a reference potential at a opposite bit line is necessary. This circuit is, for example, a dummy cell, as is described above. The dummy cell method is not preferable because it requires an extra circuit and consumes extra power when driving the dummy cell. Although another method is proposed wherein a third potential is generated and is employed as a reference potential, it is very difficult to provide a circuit for stably generating such an intermediate potential.

SUMMARY OF THE INVENTION

It is one object of the present invention to provide a semiconductor memory device wherein a precharge potential at a bit line is set to a potential differing from half the potential of a power source, and wherein a reference potential for a bit line can be generated without employing a dummy cell.

It is another object of the present invention to provide a semiconductor memory device having a precharge device which can stably set a precharge potential at a bit line lower or higher than half the potential of a power source.

To achieve the above objects, according to the present invention, during a precharging period, first a bit line is precharged to a first potential and a sense amplifier is precharged to a second potential. Then, the bit line and the sense amplifier are connected together thorough a bit line transfer gate, and the precharge potential at the bit line is set to a third potential in accordance with a ratio of their capacitances. Following this, a word line is rendered active to connect a memory cell to the bit line. In accordance with the potential in the memory cell, a minute voltage is generated to the bit line, and the sense amplifier detects the minute voltage and amplifies it. Since the first and the second potentials differ from each other, the third potential can be an intermediate potential nearer the first potential. For example, when the first potential is set to a ground potential and the second potential is set to one available at a high potential power source, the third potential is set to shift toward the ground potential from half the power source potential. Since this potential is higher than the ground potential, a potential which is higher or lower than the third potential by the equivalent of the minute voltage is generated at a selected bit line. The sense amplifier, therefore, can employ the third potential at the opposite bit line as a reference potential.

According to the present invention, a semiconductor memory device, which has a plurality of bit lines, a plurality of word lines and a plurality of memory cells provided at intersections of the bit lines and word lines, comprises:

a sense amplifier for detecting a potential generated at the bit lines;

a bit line precharge circuit for precharging the bit lines to a first potential during a precharging period;

a sense amplifier precharge circuit for, during the precharging period, precharging the sense amplifier to a second potential differing from the first potential; and a bit line transfer gate circuit for separating said bit lines and said sense amplifier when said bit lines and said sense amplifier are precharged, and for coupling said bit lines and said amplifier when the precharge are completed and said bit lines and said amplifier are released from said first and said second potential, wherein said word lines are driven after said bit line transfer gate circuit has connected said bit lines and said sense amplifier and said bit lines are set to a third potential located between said first and said second potentials.

BRIEF DESCRIPTION OF THE DRAWINGS

FIGS. 1A to 1C are diagrams for explaining the principle of the present invention;

FIGS. 2A to 2C are diagrams for explaining the principle of the present invention;

DETAILED DESCRIPTION OF THE PREFERRED EMBODIMENTS

The preferred embodiments of the present invention will now be described while referring to the accompanying drawings. The technical scope of the present invention, however, is not limited to these embodiments.

Figure 1A:
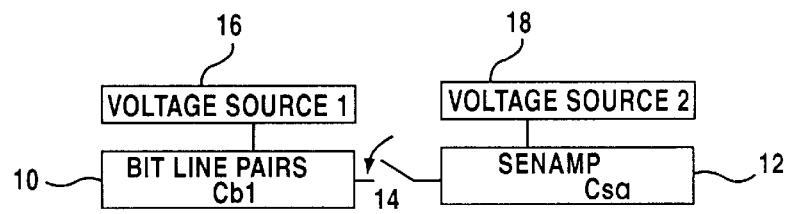
Figure 1B:
Figure 2A:
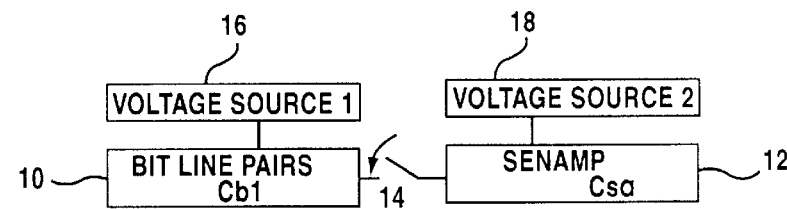
Figure 2B:
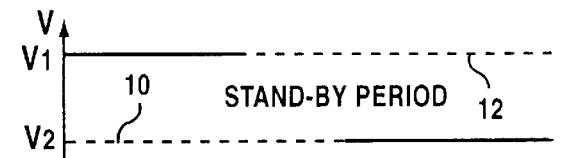

FIGS. 1A through 1C are diagrams for explaining the principle of the present invention. FIGS. 2A through 2C are also diagrams for explaining the principle of the present invention. In FIG. 1A is shown a schematic representation of a memory structure. A bit line pair 10 to be connected to a memory cell is connected to a sense amplifier 12 through a bit line transfer gate 14. A bit line precharge circuit 16 for precharging the bit line pair 10 to a first potential V1 is provided for the bit line pair 10, while a sense amplifier precharge circuit 18 for precharging a sense amplifier input pair to a second potential V2, which differs from the first potential V1, is provided for the sense amplifier 12.

In this example, as is shown in FIG. 1B, the first potential V1 is set low and the second potential V2 is set high. For example, the first potential V1 is set for a low potential power source and the second potential V2 is set for a high potential power source. In FIG. 1B are shown the potentials at the bit line pair 10 and at the sense amplifier input pair during a stand-by period. The bit line pair 10 and the sense amplifier 12 are separated from their precharge power sources during an active period, and a switch 14 of the bit line transfer gate is closed. As a result, as is shown in FIG. 1C, the third potential is determined by the ratio of the capacitance Cbl of the bit line pair 10 to the capacitance Csa of the sense amplifier 12 as follows:

$$(Cbl*V1+Csa*V2)/(Cbl+Csa).$$

Generally, since many memory cells are connected to a bit line pair, its capacitance Cbl is greater than the capacitance Csa of a sense amplifier input pair. Therefore, the third potential in FIG. 1C is a reference potential which shifts toward the first potential V1 from the center between the first potential V1 and the second potential V2. In addition, this potential is stably generated at a high reproduction rate.

Suppose that in one case a memory voltage in the memory cell is the first potential V1 and that in another case it is the second potential V2. When the word line is rendered active to connect the memory cell to the bit line, the potential at the bit line is raised or dropped from the reference voltage by the equivalent of a minute voltage. In this fashion, the sense amplifier 12 can detect a minute voltage difference by employing the reference potential. In addition, since the reference potential can be lowered below the level of half the potential of the power source by setting the first potential V1 and the second potential V2, a failure in the sense amplifier in driving the transistor does not occur.

The example in FIG. 2 differs from the example in FIG. 1 in that the first voltage V1 is set high and the second voltage V2 is set low. Therefore, when the switch 14 is closed, the potential at the bit line pair 10 and the potential at the sense amplifier input pair are an intermediate reference potential near the first potential voltage V1. Therefore, similar to the example in FIG. 1, this potential can be used as a reference voltage for a bit line.

Figure 3:
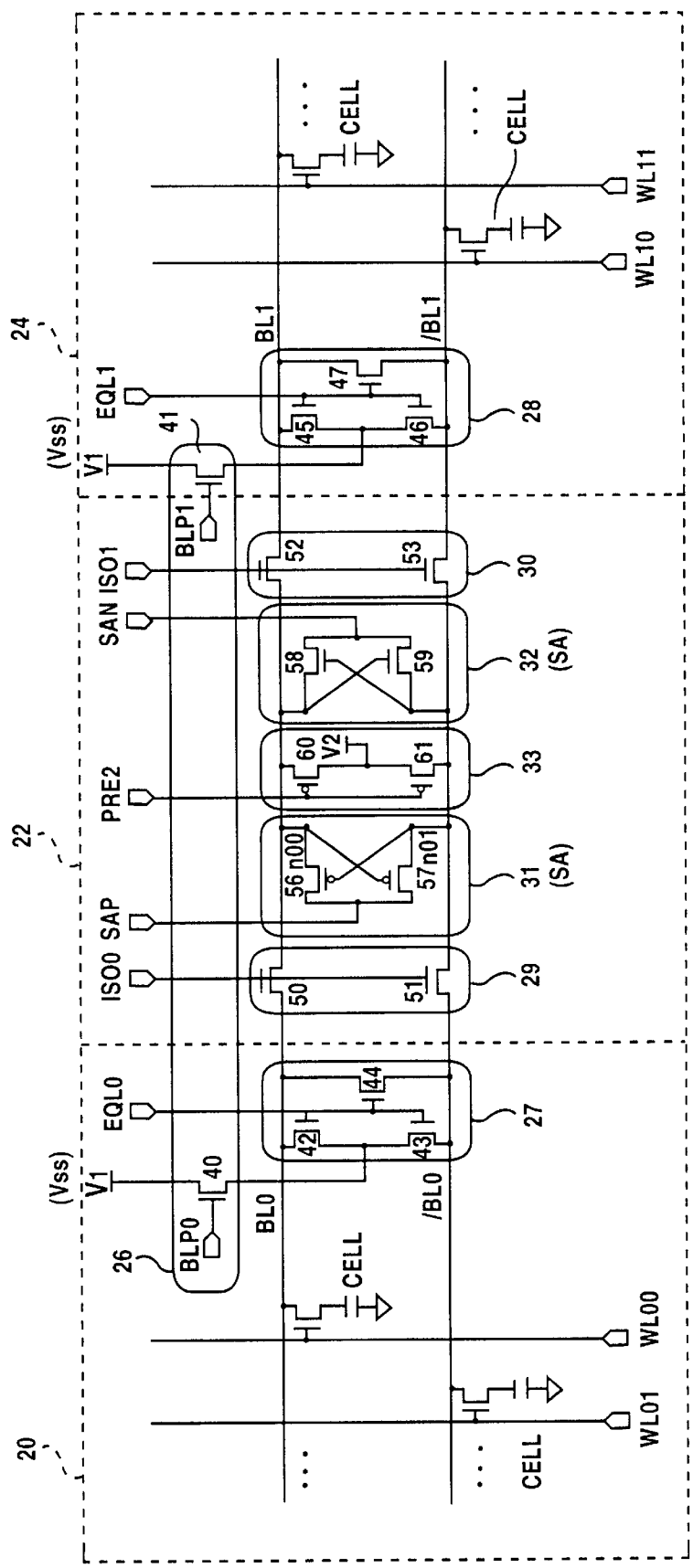
FIG. 3 is a diagram illustrating a memory circuit according to one embodiment of the present invention.

FIG. 3 is a diagram showing a memory circuit according to one embodiment of the present invention. This memory circuit corresponds to the example in FIG. 1. A sense amplifier unit 22 is provided between bit line pair portions 20 and 24 located on either side. For the bit line pair portions 20 and 24, are provided a plurality of memory cells, bit line pairs BL0 and /BL0 and BL1 and /BL1, which are disposed in a manner of a folded bit line, and word lines WL00, WL01, WL10 and WL11, which intersect these bit lines. One of the memory cells is located at each of the intersections of the bit lines and word lines. Each of the memory cells is constituted by one transistor and one capacitor, as is shown in FIG. 3.

The sense amplifier unit 22 includes sense amplifiers 31 and 32. The sense amplifiers 31 and 32 are connected to the bit line pairs BL0 and /BL0, and BL1 and /BL1 via respective bit line transfer gates 29 and 30. In the example in FIG. 3, transistors in one of the bit line transfer gates 29 and 30 are rendered on, and the bit line pair on either side is connected to a sense amplifier input pair, n00 and n01. In other words, the sense amplifiers 31 and 32 are employed in common for the bit line pairs on either side.

The sense amplifiers 31 and 32 have P type transistors 56 and 57, and N type transistors 58 and 59, respectively, and are so designed that input and output terminals of a CMOS inverter intersect and are connected together. The sense amplifiers 31 and 32 are rendered active or non-active by sense amplifier control signals SAP and SAN, which are transmitted to the common source terminals of the transistors. The bit line transfer gates 29 and 30 have N type transistors 50 and 51, and 52 and 53, respectively, and one of the transistors in each gate is rendered on by a bit line transfer gate select signal ISO0 or ISO1.

In the circuit in FIG. 3, as is explained while referring to FIG. 1, bit line pair precharge circuits 26 and 27 precharge the bit line pairs BL0 and /BL0, and BL1 and /BL1 to the first potential V1 during the stand-by period (precharging period). The sense amplifier precharge circuit 33 precharges the sense amplifier input pair, n00 and n01, to the second potential V2 during the stand-by period (precharging period). The bit line pair on the left is precharged by the circuits 26 and 27, and the bit line pair on the right is precharged by the circuits 26 and 28.

The bit line precharge circuits 26, 27 and 28 are constituted by N type transistors 40 to 47, and is controlled by right and left bit line precharge signals BLP0 and BLP1. The bit line precharge circuits 27 and 28 respectively include short circuit transistors 44 and 47 for short-circuiting the bit line pair, and are controlled by equalize signals EQL0 and EQL1. When the bit line precharge signals BLP0 and BLP1, and the equalize signals EQL0 and EQL1 are driven to level H, the bit line pair is precharged at the first potential V1.

The sense amplifier precharge circuit 33 is constituted by P type transistors 60 and 61, and is controlled by a bit line precharge signal PRE2 which becomes level L when precharge. Since the second potential V2 is high, P type transistors are employed to ensure the precharge of the sense amplifier input pair n00 and n01 to the second potential V2. The sense amplifier precharge circuit 33 may be constituted by N type transistors, and in this case, the bit line precharge signal PRE2 has the opposite polarity when precharge. In the example shown in FIG. 3, when the bit line precharge signal PRE2 is at level L in the precharge period, the sense amplifier input pair n00 and n01 are precharged to the second potential V2.

Figure 4:
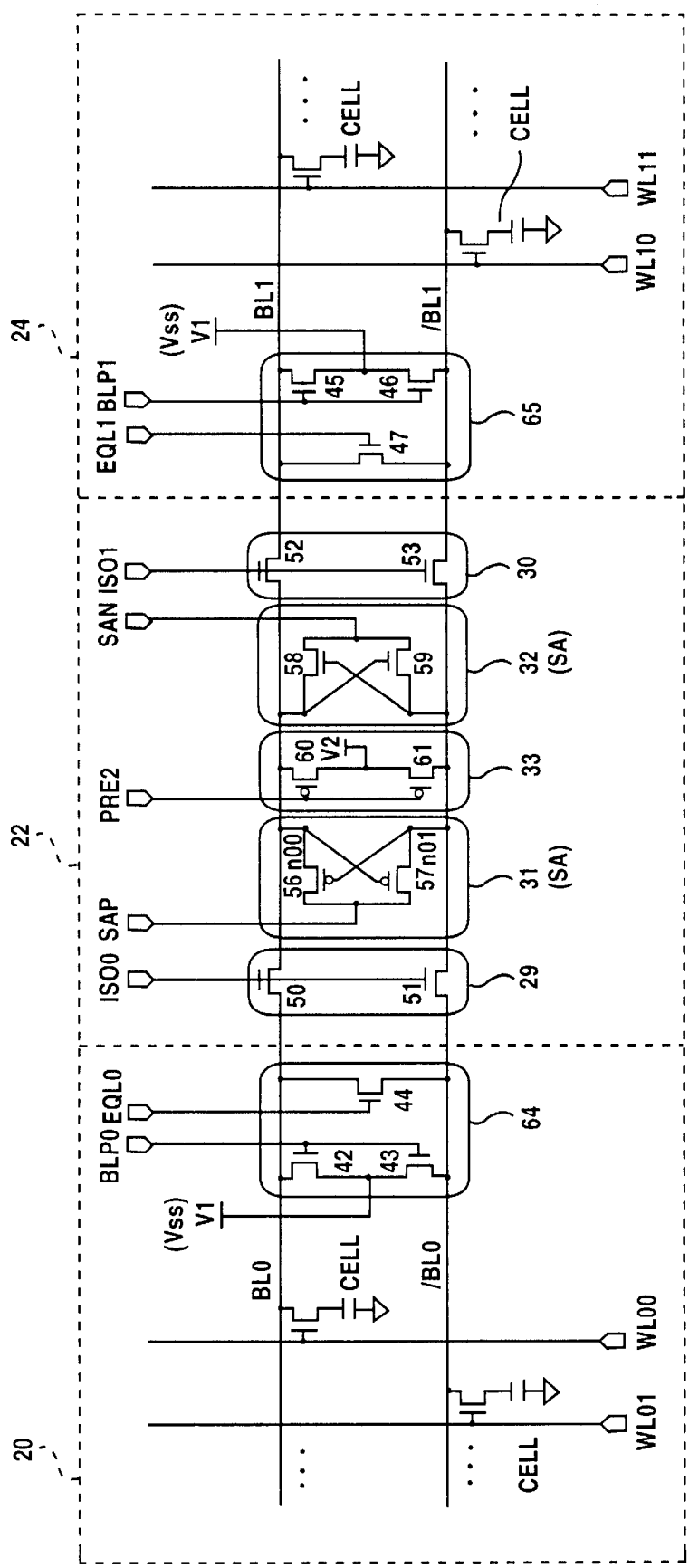
FIG. 4 is a diagram illustrating a modification of the memory circuit in FIG. 3.

FIG. 4 is a diagram illustrating a modification of the memory circuit in FIG. 3. The same reference numerals as are used in FIG. 3 are used to denote corresponding or identical components in FIG. 3. In the circuit example in FIG. 4, bit line precharge circuits 64 and 65 differ from the circuits in FIG. 3. The bit line precharge circuits 64 and 65 have substantially the same arrangements as the circuits 27 and 28 in FIG. 3. It should be noted, however, that transistors 42 and 43 are controlled by a bit line precharge signal BLP0, and that a transistor 44 is controlled by an equalize signal EQL0. Furthermore, transistors 45 and 46 are controlled by a bit line precharge signal BLP1, and a transistor 47 is controlled by an equalize signal EQL1. The other arrangements for the modification are the same as those for the memory circuit in FIG. 3.

Figure 5:
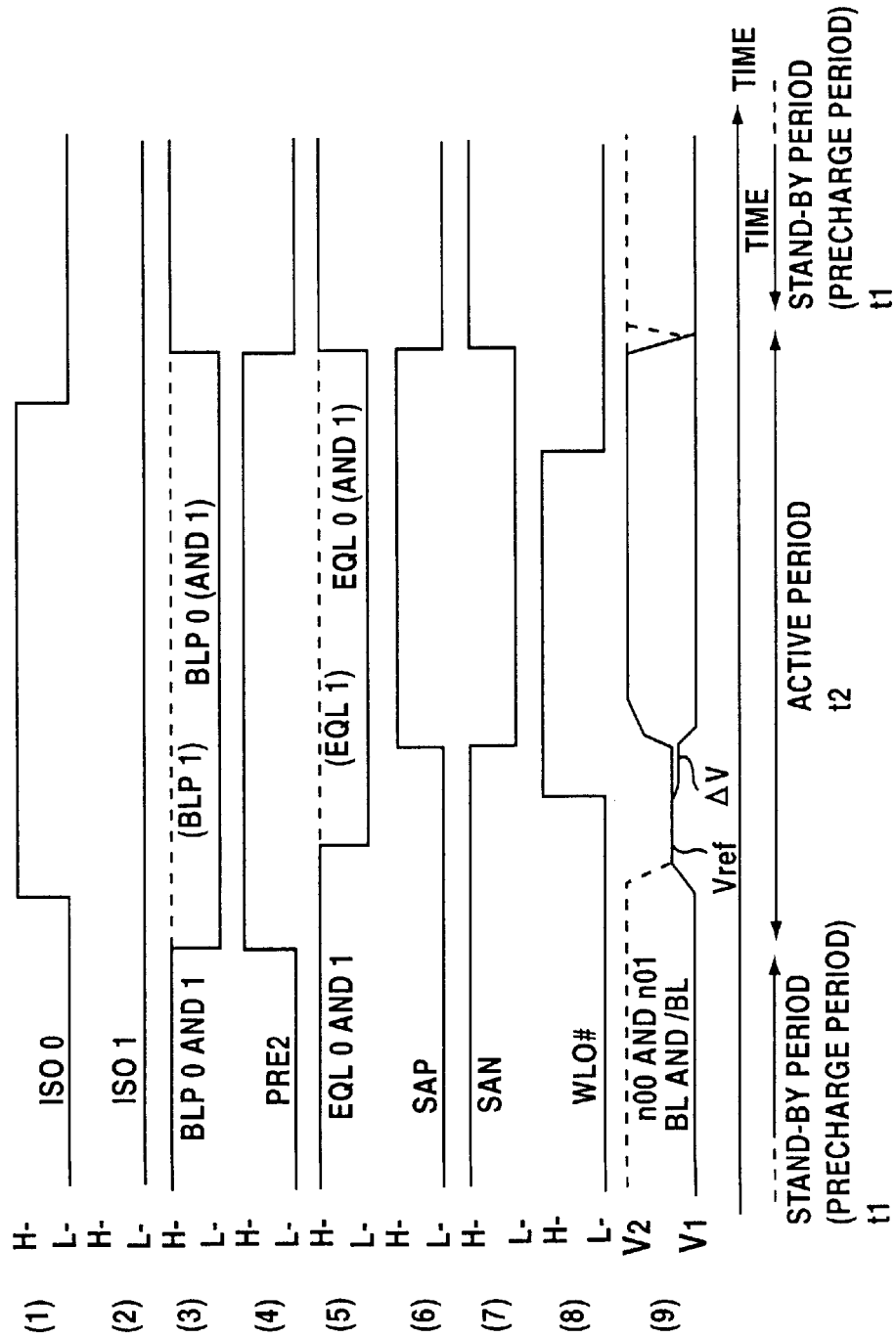
FIG. 5 is a timing chart for explaining an operation performed by the memory circuits in FIGS. 3 and 4.

FIG. 5 is a timing chart for explaining the operation of the memory circuit in FIGS. 3 and 4. The timing chart shows only the order of control signals and terminal signals, and the horizontal axis, which indicates the time, and the vertical axis, which indicates potentials, provide no particular meanings. In the example in FIG. 5, the first potential V1 is set to a low potential power source, and the second potential V2 is set to a high potential power source. More specifically, the first potential V1 is a ground potential Vss, and the second potential V2 is the level of the internal reduced voltage power source Vii, which is internally generated. Generally, the potential of the internal reduced voltage power source Vii is a voltage obtained by reducing the external power voltage Vcc by a predetermined potential and by stabilizing the resultant voltage.

In FIG. 5, a stand-by period (precharging period) t1, an active period t2 and a stand-by period t1 are shown along the time axis. First, in the stand-by period t1, the bit line transfer gate select signals ISO0 and ISO1 are at level L, and the bit line transfer gates 29 and 30 are not conductive. Therefore, the bit line pair and the sense amplifier are electrically disconnected. The equalize signals EQL0 and EQL1 and the bit line precharge signals BLP0 and BLP1 are at level H, and the bit line pair is precharged to the first potential V1. The sense amplifier precharge signal PRE2 is at level L, the transistors 60 and 61 are rendered conductive, and the sense amplifier input pairs n00 and n01 are precharged to the second potential V2. At this time, the sense amplifier control signals SAP and SAN are controlled to level L (level V1) and level H (level V2), and the transistors of the sense amplifier are not rendered conductive in accordance with the level of the precharge potential V2 of the sense amplifier.

Suppose that the bit line pair circuit 20 on the left is selected. Immediately before the active period t2 begins, the precharge signals BLP0 and PRE2 go to level L and level H respectively, to release the bit line pair in the circuit 20 from the first potential V1, and the sense amplifier input pair n00 and n01 from the second potential V2. At this time, the bit line pair BL0 and /BL0 are short-circuited by the transistor 44, and maintained at the same potential. Then, only the left bit line transfer gate signal ISO0 for the selected circuit goes to level H, and the bit line pair BL0 and /BL0 are connected to the sense amplifier input pair n00 and n01. As a result, the potentials at the bit line pair and the sense amplifier input pair are the previously described intermediate reference potential Vref, which is determined by using the ratio of their capacitances Cbl and Csa. Generally, the capacitance Cbl of the bit line pair, to which many memory cells are connected, is greater than the capacitance Csa of the sense amplifier, so that the reference voltage Vref is set to an intermediate potential which is lower than half the potential between the internal reduced voltage power source Vii and the ground potential Vss. If the second potential V2 is set lower than the level of the internal reduced power source Vii, the reference potential Vref can be nearer the ground potential. At this time, since the sense amplifier control signal SAP is lower than the reference potential Vref, while the sense amplifier control signal SAN is higher, the transistors of the sense amplifier circuit are not driven.

Following this, the equalize signal EQL0 goes to level L, and the bit line pairs BL0 and, /BL0 are disconnected. Then, a word line WL0# (# is any number) goes to level H. Generally, the word line is set to a higher potential than that of the internal power source Vii. As a result, the voltage at the memory cell is read to the bit lines, and one of the bit lines is lowered or raised by the equivalent of a minute potential $\Delta V$. In the example in FIG. 5, the potential of one of the bit line is reduced by $\Delta V$.

When a minute voltage is generated between the bit line pair, the sense amplifier control signals SAP and SAN go to level H and level L respectively, to activate the sense amplifiers 31 and 32. That is, to drive them, a voltage that exceeds a threshold voltage is applied between the gates and the sources of the transistors of the sense amplifiers. As a result, the potential at the bit line pair is greatly amplified. In this embodiment, since the reference potential Vref for the bit line pair is nearer to the ground potential Vss (the first potential V1 in this example), ordinarily the P transistors 56 and 57 of the sense amplifiers 31 and 32 are driven first. Therefore, when the sense amplifier control signal SAP goes to level H slightly earlier than the sense amplifier control signal SAN goes to level L, the sense amplifiers can be driven smoothly.

The potentials at the nodes n00 and n01, which are amplified by the sense amplifiers, are output to a data bus line through a column gate (not shown). The output is rewritten in the memory cell and the word line falls. In the stand-by period t1, the bit line transfer signal ISO0 goes to level L, and the bit line transfer gate 29 is rendered nonconductive. Further, the other control signals go to the level in the original stand-by state. In other words, the bit line pair is precharged to the first potential V1 and the sense amplifiers are precharged to the second potential V2.

The operation performed for the memories in FIGS. 3 and 4 has been explained. In the above circuits, since the reference potential Vref at the bit line pair is shifted toward the ground potential from half the potential of the power source Vii, the minute voltage can be precisely detected by the sense amplifiers, although a leak of the memory cell at level H may occur. That is, the level H in the memory cell tends to be reduced by, for example, a leak through a cell transistor or a leak through a cell capacitor. In this case, if the reference potential is half the potential of the power source, a difference between level H, when reduced by the leak, and the reference potential becomes smaller, and a minute voltage generated at the bit line is also reduced. On the other hand, in the above embodiment, since the reference potential at the bit line is shifted toward the ground side from the potential of the power source, a sufficiently large voltage is generated at the bit line, even if the level H of the memory cell has been reduced by a leak. Since the level L side of the memory cell is at a ground potential, there is negligibly small change due to a leak.

In the above explained operation with reference to FIG. 5, the bit line precharge BLP1 and the equalize signal EQL1 at the non-active word line WL side may be the same as BLP0 and EQL1 (shown as a solid line in FIG. 5) or may not be changed (shown as dotted line in FIG. 5).

Figure 6:
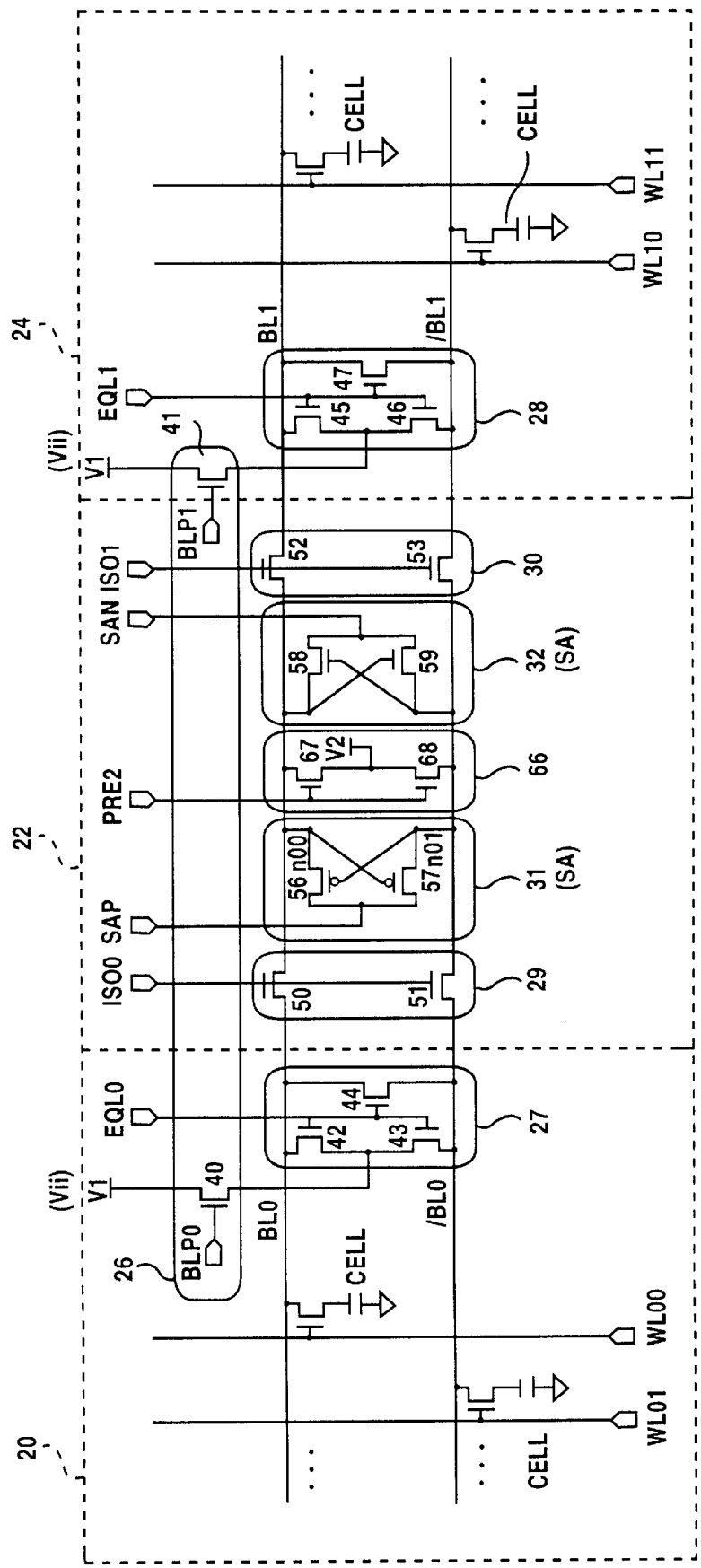
FIG. 6 is a diagram illustrating a memory circuit according to another embodiment of the present invention.

FIG. 6 is a diagram illustrating a memory circuit according to another embodiment of the present invention. This embodiment corresponds to the example in FIG. 2. In this embodiment, differing from that in FIG. 3, a first potential V1 is higher than a second potential V2. Therefore, the reference potential Vref of the bit line pair is shifted toward the first potential V1. In this example, specifically, the first potential V1 serves as that for the internal power source Vii, and the second potential V2 serves as ground potential Vss. The first potential V1 may not be the one for the internal power source Vii, but may be another higher potential.

In FIG. 6, the same reference numerals are used to denote corresponding or identical components as are used in FIG. 3. The difference from the circuit in FIG. 3 is that a sense amplifier precharge circuit 66 is constituted by N type transistors 67 and 68. Since the second potential V2 is low, N type transistors are employed instead of P type transistors. Accordingly, a sense amplifier precharge signal PRE2 has a polarity opposite to that in FIG. 3. Bit line precharge circuits 26, 27 and 28 have the same arrangement as those in FIG. 3. It should be noted, however, that since the first potential V1 is high, bit line precharge signals BLP0 and BLP1 and equalize signals EQL0 and EQL1, which are signals for controlling transistors 40 through 44, are controlled to level H higher than the first potential V1 by the threshold value of the transistor.

Figure 7:
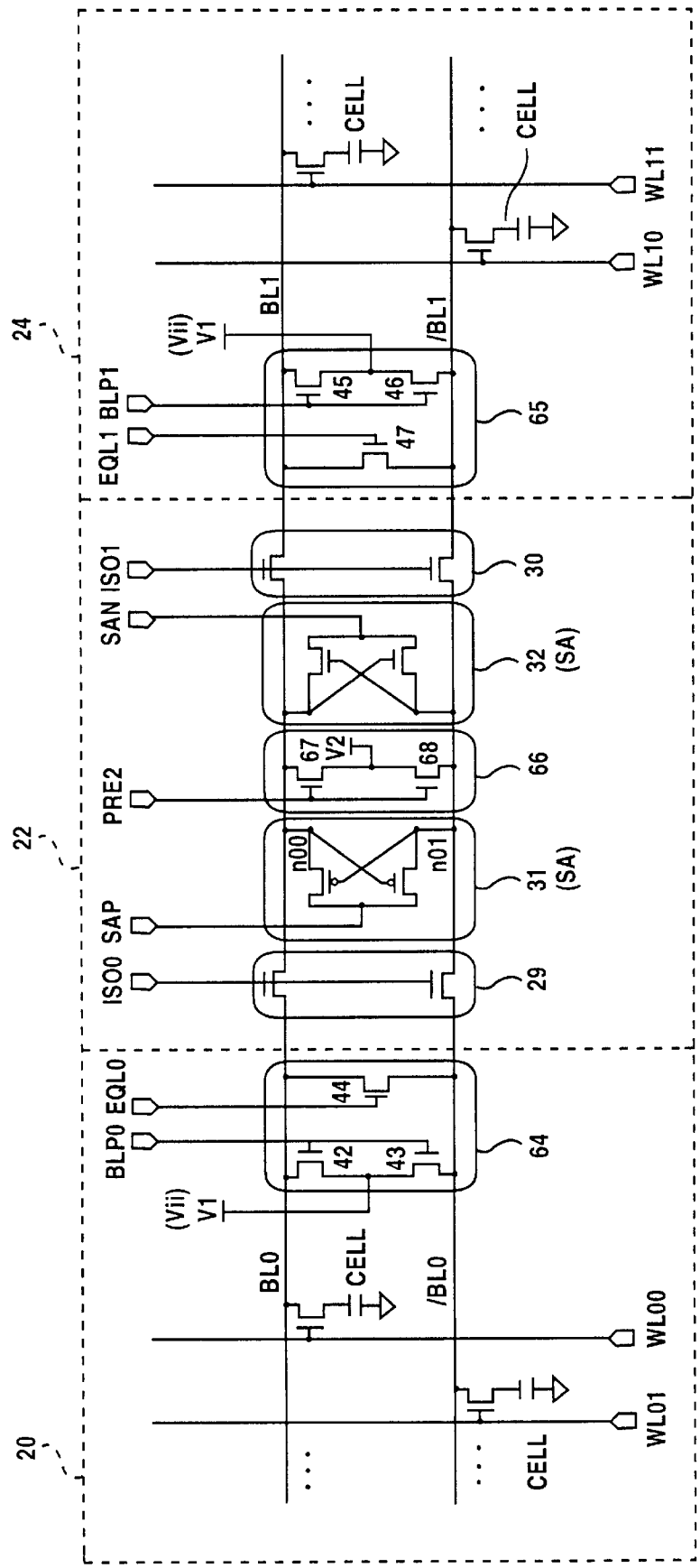
FIG. 7 is a diagram illustrating a modification of the memory circuit in FIG. 6.

FIG. 7 is a diagram showing a modification of the circuit in FIG. 6. The same reference numerals are used to denote corresponding or identical components in FIG. 7 as are used in FIG. 4. In the circuit in FIG. 7, as well as in FIG. 4, bit line precharge circuits 64 and 65 differ from those in FIG. 6. In the bit line precharge circuits 64 and 65, N type transistors 42, 43, 45 and 46 are controlled by bit line precharge signals BLP0 and BLP1, and bit line shortcircuit transistors 44 and 47 are controlled by equalize signals EQL0 and EQL1, respectively. A sense amplifier precharge circuit 66 in FIG. 7 differs from the precharge circuit 33 in FIG. 4, and is constituted by N type transistors as is the circuit in FIG. 6.

Figure 8:
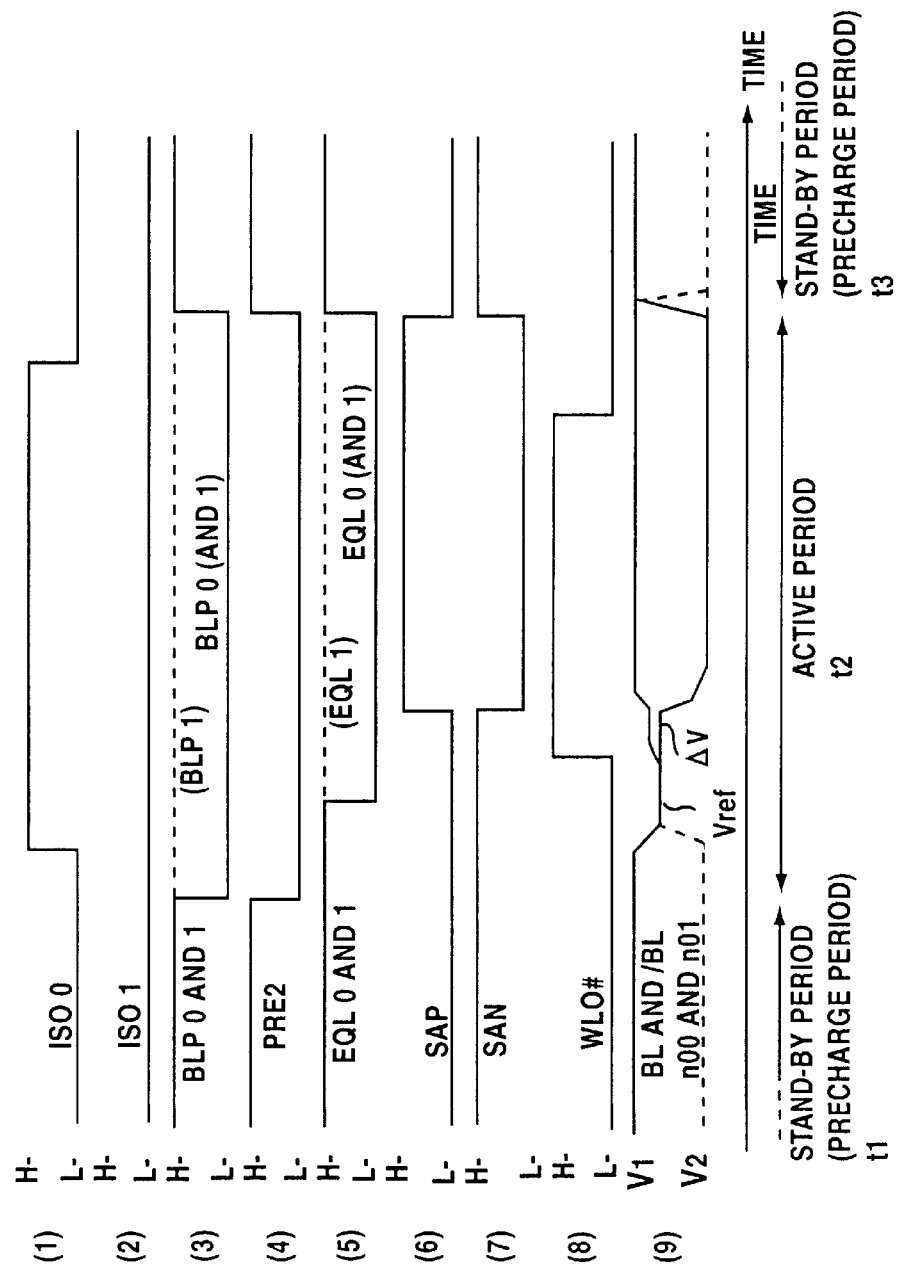
FIG. 8 is a timing chart for explaining an operation performed by the memory circuits in FIGS. 6 and 7.

FIG. 8 is a timing chart showing the operation of the circuit in FIG. 7. The timing chart in FIG. 8 is the same as that in FIG. 5, except that, as previously described, the sense amplifier precharge signal PRE2 has the opposite polarity, that the first potential V1 is high and the second potential V2 is low, and that the reference potential Vref of the bit line is shifted toward the higher potential.

The operations during the stand-by period t1 and the active period t2 are the same as those in FIG. 5. To explain them briefly, during the stand-by period t2 which is a precharge period, the bit line pair is precharged to the first potential V1, which is the potential of the internal power source Vii, and the input terminals n00 and n01 of the sense amplifier are precharged to the second potential V2, which is the ground potential Vss. Then, their precharge signals BLP0 and PRE2 go to level L, and the bit line pair and the sense amplifier are separated from the first potential V1 and the second potential V2 respectively. If the circuit 20 for the left bit line pair is selected, the bit transfer signal ISO0 goes to level H and the sense amplifier input pair n00 and n01 are connected to the bit line pair BL0 and /BL0, so that the input pair and the bit line pair are set to the reference potential Vref in accordance with the ratio of their capacitances.

Following this, the equalize signal EQL0 goes to level L to separate the bit line pair BL0 and /BL0, and the word line is activated. As a result, a minute voltage $\Delta V$ is generated on one bit line. The sense amplifiers 31 and 32 amplify this voltage. In this case, since the bit line reference potential Vref is shifted to the higher potential side, first the activation signal SAP for the sense amplifier goes to level H and then the other activation signal SAN goes to level L, so that the operation of the sense amplifier can be more smoothly performed.

During the reset period t1, the word line is deactivated and the operation condition is returned to the state during the first stand-by period.

Figure 9:
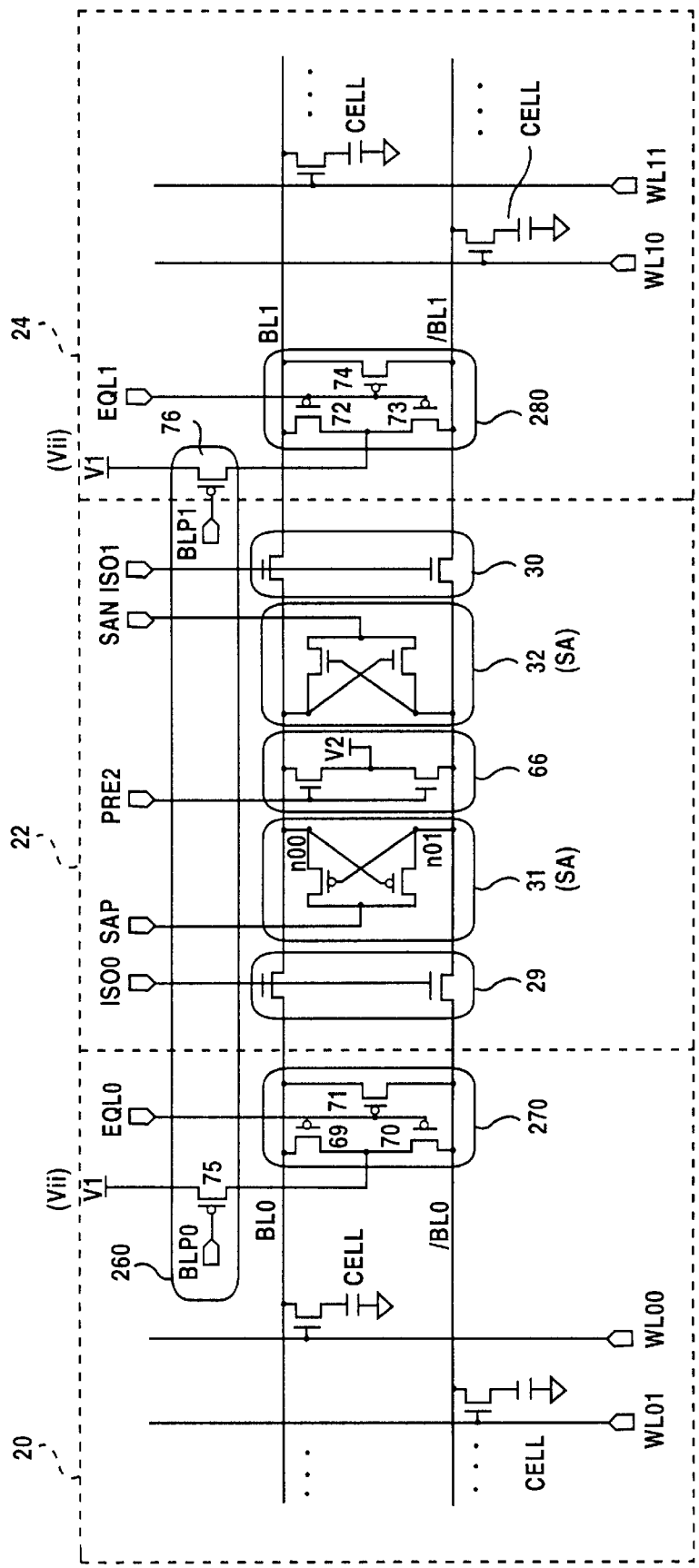
FIG. 9 is a diagram illustrating another modification of the memory circuit shown in FIG. 6.

FIG. 9 is a diagram showing a modification of the circuit in FIG. 6. Since a first potential V1 is high, bit line precharge circuits 260, 270 and 280 are constituted by P type transistors 69 through 76. Therefore, precharge control signals BLP0 and BLP1 and equalize signals EQL0 and EQL1 have a polarity opposite to that in FIG. 6. Since the rest of the arrangement is identical, the same reference numerals are employed to denote corresponding components.

Figure 10:
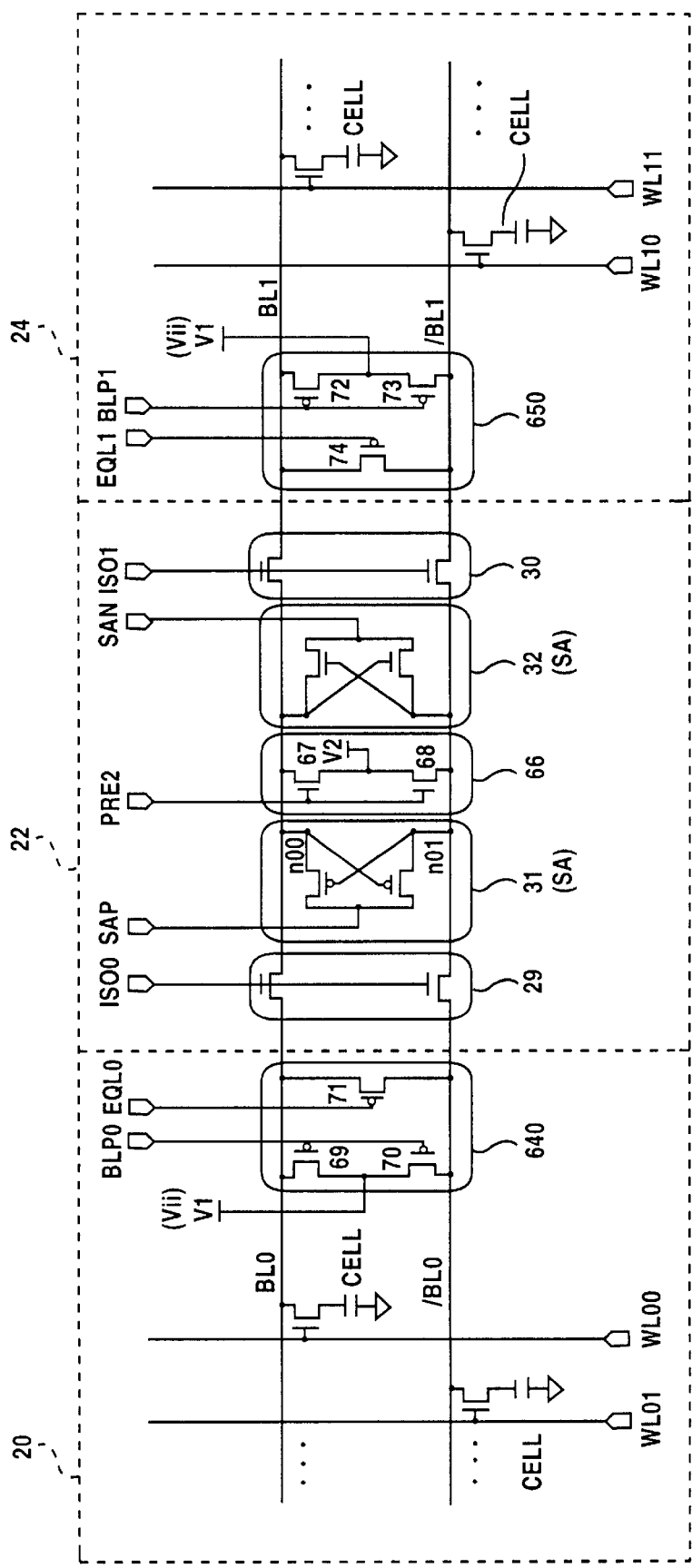
FIG. 10 is a diagram illustrating a modification of the memory circuit shown in FIG. 7.

FIG. 10 is a diagram showing a modification of the circuit in FIG. 7. Since a first potential V1 is high, bit line precharge circuits 670 and 680 are constituted by P type transistors 69 through 74. Therefore, precharge control signals BLP0 and BLP1 and equalize signals EQL0 and EQL1 have a polarity opposite to that in FIG. 7. Since the rest of the arrangement is identical, the same reference numerals are employed to denote corresponding components.

Figure 11:
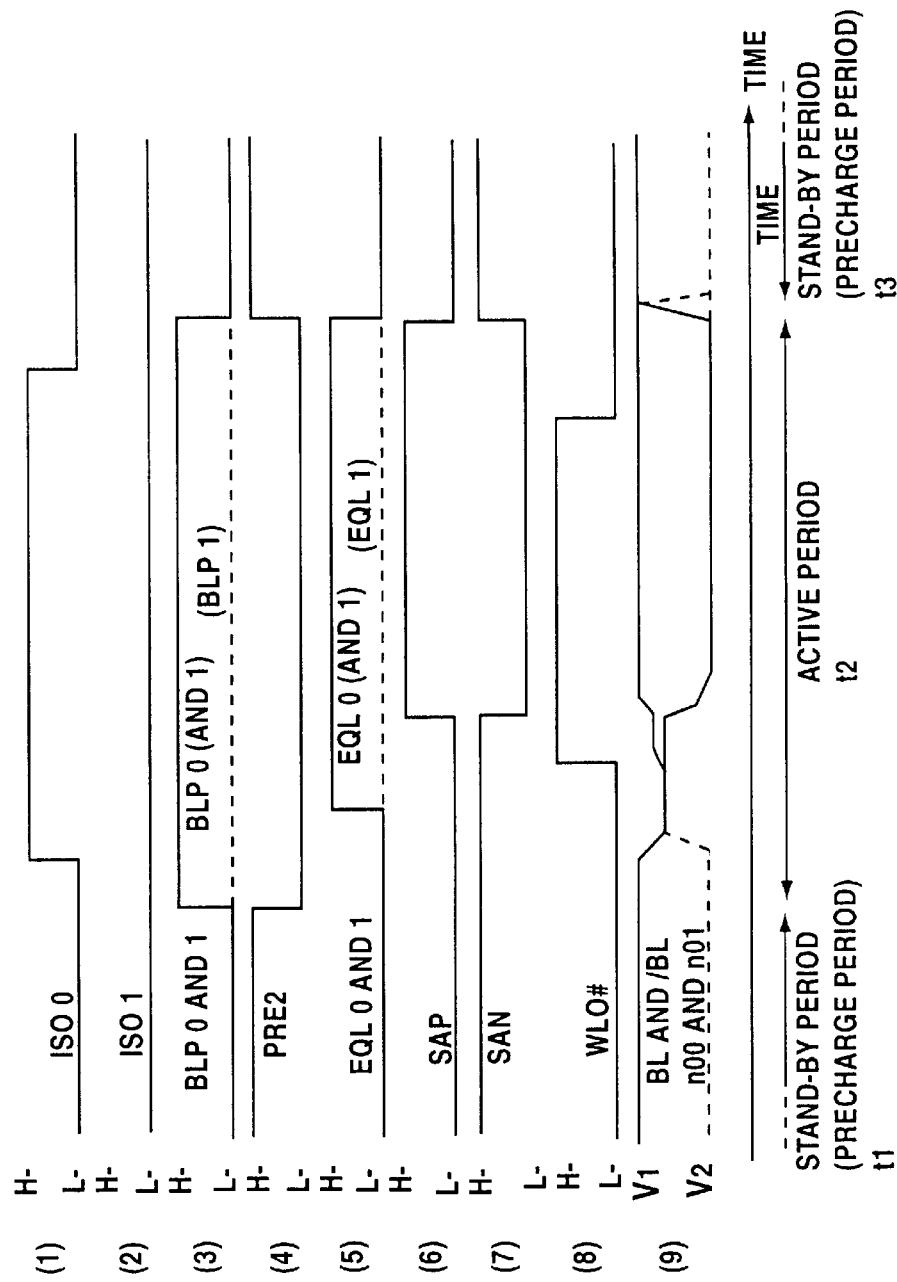
FIG. 11 is a timing chart showing an operation performed by the memory circuits in FIGS. 9 and 10.

FIG. 11 is a timing chart showing an operation for the circuits in FIGS. 9 and 10. As is described above, in the circuits in FIGS. 9 and 10, the bit line precharge signals BLP0 and BLP1 and the equalize signals EQL0 and EQL1 have a polarity opposite to that of the circuits in FIGS. 6 and 7. Therefore, the signals BLP0, BLP1, EQL0 and EQL1 in FIG. 11 have a polarity opposite to that in FIG. 8. Since the other portions of the operation are the same, no further explanation for the operation will be given.

Again, with reference to FIG. 8 and FIG. 11, the bit line precharge signal BLP1 and the equalize signal EQ1 at the non-active word line WL side may be the same as BLP0 and EQ1 (shown as solid line in FIGS. 8 and 11) or may not be changed (shown as dotted line in FIGS. 8 and 11).

Figure 12:
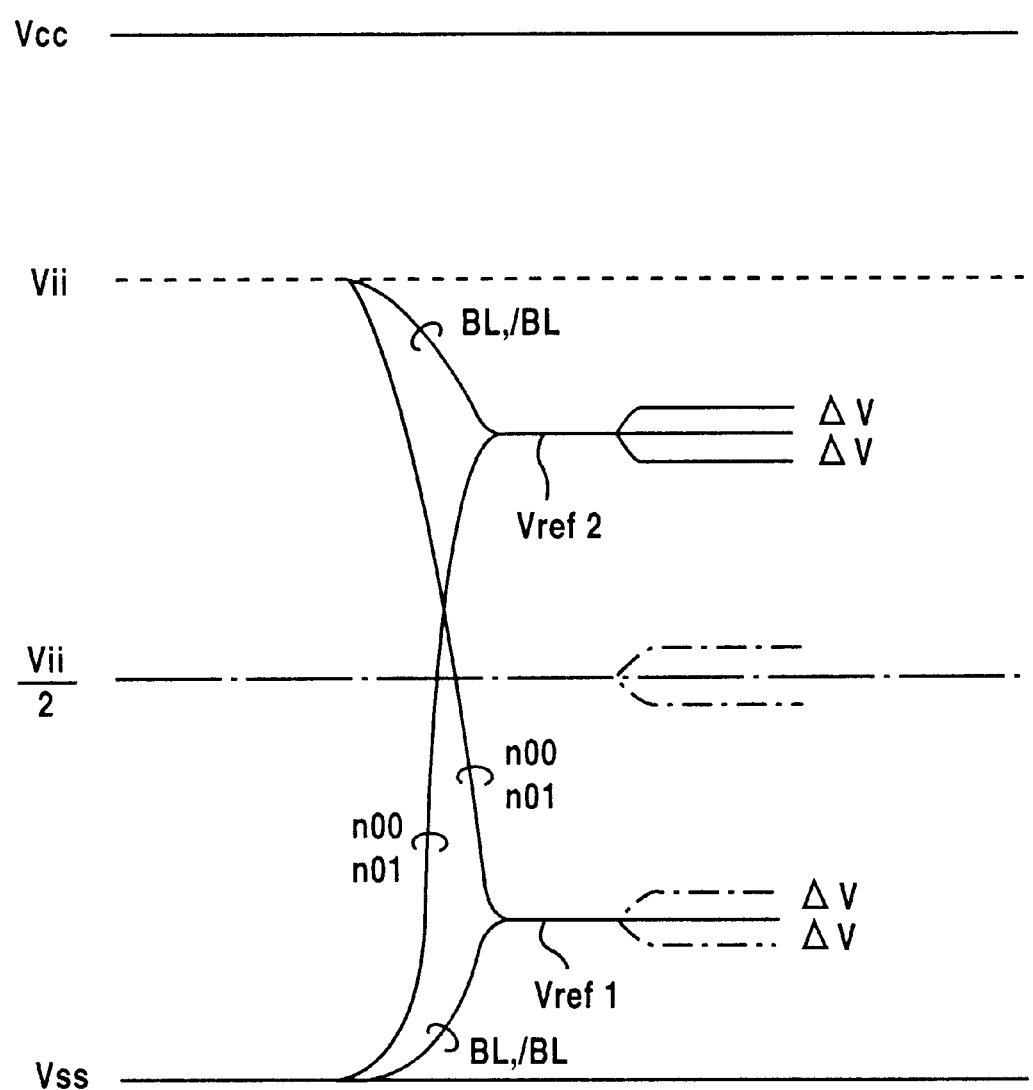
FIG. 12 is a diagram showing specific potentials employed in the embodiments.

FIG. 12 is a diagram showing specific potentials in the above embodiments. In the embodiment explained while referring to FIGS. 3 to 5, the precharge potential V1 for the bit line pair is set low, and the precharge potential V2 for the sense amplifier is set high. In FIG. 12 is an example where the first potential is set to the ground potential Vss and the second potential V2 is set to the potential for the internal reduced voltage power source Vii. Generally, the internal reduced voltage power source Vii is a stable, internal power source whose potential is obtained by reducing, by a predetermined voltage, a high potential power voltage Vcc which is supplied from the outside. As is shown in FIG. 12, when the sense amplifiers and the bit line pair are short-circuited at the bit line transfer gate, the reference potential Vref1 at the bit line pair becomes a potential between half the internal power voltage Vii and the ground potential Vss. The potential at the bit line is raised above or lowered below the reference potential Vref1 by the minute voltage ΔV.

In the embodiment shown in FIGS. 6 to 11, the precharge potential V1 at the bit line pair is set high and the precharge potential V2 at the sense amplifiers is set low. In FIG. 12 is shown a specific example where the first potential V1 is set to the potential in the internal reduced voltage power source Vii and the second potential V2 is set to ground potential Vss. The reference potential Vref2 at the bit line in this case is a potential between the potential of the internal power source Vii and half of its potential.

The first potential V1 and the second potential V2 are not necessarily the power source Vii or Vss, and an arbitrary potential can be employed for them so that an optimal bit line reference voltage Vref can be set.

As is described above, according to the present invention, since the precharge potential for the bit line can be set to an intermediate potential which is higher or lower than half the potential of the high power source, the operation of the sense amplifiers can be precisely performed. In addition, a specific circuit is not required for the employment of a dummy cell or a dummy capacitor to generate a reference potential to a bit line. When the precharge potential at the bit line is set lower than half the potential of the high power source, even though level H of the memory cell is reduced due to the leak, an effective minute voltage can be generated at the bit line so that reading can be performed precisely.

What is claimed is:

1. A semiconductor memory device, which has a plurality of bit lines, a plurality of word lines and a plurality of memory cells provided at intersections of said bit lines and word lines, comprising:

a sense amplifier for detecting a potential generated at said bit lines;

a bit line precharge circuit for precharging said bit lines to a first potential during a precharging period;

a sense amplifier precharge circuit for, during said precharging period, precharging said sense amplifier to a second potential differing from said first potential; and a bit line transfer gate circuit for separating said bit lines and said sense amplifier when said bit lines and said sense amplifier are precharged, and for coupling said bit lines and said sense amplifier when the precharge are completed and said bit lines and said sense amplifier are released from said first and said second potentials, wherein said word lines are driven after said bit line transfer gate circuit has connected said bit lines and said sense amplifier and said bit lines are set to a third potential between said first and said second potentials.

2. The semiconductor memory device according to claim 1, wherein said sense amplifier detects a voltage generated between a pair of bit lines, further comprising a bit line short-circuit for short-circuiting said pair of bit lines during said precharge period, and for releasing said short-circuiting between said pair of bit lines after said pair of bit lines have been set to said third potential and before said word lines are driven.

3. The semiconductor memory device according to claim 1, wherein said sense amplifier is formed by intersecting and connecting an input pair and an output pair of a pair of CMOS inverters;

a first sense amplifier control signal to be supplied to sources of P type transistors of said CMOS inverters is set to a fourth potential for rendering said P type transistors non-conductive during said precharge period, and is set to a fifth potential for activating said P type transistors to detect potentials at said bit lines; and a second sense amplifier control signal to be supplied to sources of N type transistors of said CMOS inverters is set to a sixth potential for rendering said N type transistors non-conductive during said precharge period, and is set to a seventh potential for activating said N type transistors to detect potentials at said bit lines.

4. The semiconductor memory device according to claim 3, wherein said fourth potential is lower than said third potential, and said sixth potential is higher than said third potential.

5. The semiconductor memory device according to claim 1, wherein said first potential is a ground potential, and said second potential is a power source potential.

6. The semiconductor memory device according to claim 1, wherein said first potential is a power source potential, and said second potential is a ground potential.

7. The semiconductor memory device according to claim 5 or 6, wherein said third potential is shifted to said ground potential or to said power source potential, from half of said power source potential.

* * * * *